(12) United States Patent
Zou

(10) Patent No.: US 10,566,494 B2
(45) Date of Patent: Feb. 18, 2020

(54) MICRO-LED TRANSFER METHOD AND MANUFACTURING METHOD

(71) Applicant: Goertek Inc., Weifang, Shandong (CN)

(72) Inventor: Quanbo Zou, Weifang (CN)

(73) Assignee: Goertek Inc., Shandong (CN)

( * ) Notice: Subject to any disclaimer, the term of this patent is extended or adjusted under 35 U.S.C. 154(b) by 0 days.

(21) Appl. No.: 16/064,917

(22) PCT Filed: Dec. 23, 2015

(86) PCT No.: PCT/CN2015/098429
§ 371 (c)(1),
(2) Date: Jun. 21, 2018

(87) PCT Pub. No.: WO2017/107097
PCT Pub. Date: Jun. 29, 2017

(65) Prior Publication Data
US 2018/0374987 A1 Dec. 27, 2018

(51) Int. Cl.
*H01L 21/67* (2006.01)
*H01L 33/00* (2010.01)
(Continued)

(52) U.S. Cl.
CPC .... *H01L 33/0095* (2013.01); *H01L 21/67132* (2013.01); *H01L 21/67144* (2013.01);
(Continued)

(58) Field of Classification Search
CPC ........... H01L 33/0095; H01L 21/67132; H01L 21/67144; H01L 25/0753; H01L 24/83;
(Continued)

(56) References Cited

U.S. PATENT DOCUMENTS 8,333,860 B1 12/2012 Bibl et al.
8,426,227 B1 * 4/2013 Bibl ........................ H01L 33/04
438/27

(Continued)

FOREIGN PATENT DOCUMENTS

CN 1513204 A 7/2004
CN 101211809 A 7/2008
(Continued)

OTHER PUBLICATIONS

International Searching Authority, International Search Report and Written Opinion for International Application No. PCT/CN2015/098429, dated Mar. 25, 2016, 8 pages, State Intellectual Property Office of the P.R.C., China.

*Primary Examiner* — Matthew C Landau
*Assistant Examiner* — Dmitriy Yemelyanov
(74) *Attorney, Agent, or Firm* — Alston & Bird LLP

(57) ABSTRACT

A micro-LED transfer method and a manufacturing method are disclosed. The micro-LED transfer method comprises: coating a sacrificial layer on a carrier substrate, wherein micro-LEDs are bonded on the carrier substrate through a first bonding layer (S1100); patterning the sacrificial layer to expose micro-LEDs to be picked up (S1200); bonding the micro-LEDs to be picked up with a pickup substrate through a second bonding layer (S1300); removing the sacrificial layer by undercutting (S1400); lifting-off the micro-LEDs to be picked up from the carrier substrate (S1500); bonding the micro-LEDs on the pickup substrate with a receiving substrate through a third bonding layer (S1600); and lifting-off the micro-LEDs from the pickup substrate (S1700).

10 Claims, 6 Drawing Sheets

(51) Int. Cl.
*H01L 25/075* (2006.01)
*H01L 21/683* (2006.01)
*H01L 23/00* (2006.01)
*H01L 33/48* (2010.01)

(52) U.S. Cl.
CPC ...... *H01L 21/6835* (2013.01); *H01L 25/0753* (2013.01); *H01L 24/83* (2013.01); *H01L 33/48* (2013.01); *H01L 2221/68322* (2013.01); *H01L 2221/68354* (2013.01); *H01L 2221/68381* (2013.01); *H01L 2224/83005* (2013.01)

(58) Field of Classification Search
CPC ........... H01L 33/48; H01L 2221/68322; H01L 2224/83005
See application file for complete search history.

(56) References Cited

U.S. PATENT DOCUMENTS

| | | | |
|---|---|---|---|
| 2004/0104272 A1 | 6/2004 | Figuet et al. | |
| 2008/0160725 A1 | 7/2008 | Byun et al. | |
| 2008/0318352 A1* | 12/2008 | Foote | B41J 2/155 438/21 |
| 2010/0110157 A1* | 5/2010 | Yonehara | B41J 2/45 347/130 |
| 2014/0340900 A1 | 11/2014 | Bathurst et al. | |

FOREIGN PATENT DOCUMENTS

| | | | |
|---|---|---|---|
| JP | 2008-060608 A | 3/2008 | |
| WO | WO-2016122725 A1 * | 8/2016 | ............. H01L 33/20 |

* cited by examiner

US 10,566,494 B2

MICRO-LED TRANSFER METHOD AND MANUFACTURING METHOD

CROSS REFERENCE TO RELATED APPLICATIONS

This application is a National Stage Application, filed under 35 U.S.C. 371, of International Application No. PCT/CN2015/098429, filed Dec. 23, 2015; the contents of which as are hereby incorporated by reference in their entirety.

BACKGROUND

Related Field

The present invention relates to the technical field of micro-LED, and in particular, relates to a micro-LED transfer method and a method for manufacturing a micro-LED device

Description of Related Art

The micro-LED technology refers to the LED array of small size integrated on a substrate with high density. Currently, the micro-LED technology is under development, and it is expected in the industry that a high-quality micro-LED product comes into the market. High-quality micro-LED will have a deep affection on the conventional display products such as LCD/OLED that have already been put into the market.

Until now, how to transfer micro-LEDs to a receiving substrate of a micro-LED device has always been a technical task to be improved by a technician.

In the prior art, a pickup head is used to transfer micro-LEDs. The approaches using pickup heads are relatively complicated and have problems in the aspects of yield and stability.

For example, the U.S. Pat. No. 8,333,860B1 discloses a micro device transfer head and a method of transferring one or more micro devices to a receiving substrate. This patent is hereby incorporated herein as a whole as a reference.

The U.S. Pat. No. 8,426,227B1 discloses a micro light emitting diode LED and a method of forming an array of micro LEDs for transfer to a receiving substrate. This patent is hereby incorporated herein as a whole as a reference.

BRIEF SUMMARY

One object of this invention is to provide a new technical solution for micro-LED transfer.

According to a first aspect of the present invention, there is provided a micro-LED transfer method, comprising: coating a sacrificial layer on a carrier substrate, wherein micro-LEDs are bonded on the carrier substrate through a first bonding layer; patterning the sacrificial layer to expose micro-LEDs to be picked up; bonding the micro-LEDs to be picked up with a pickup substrate through a second bonding layer; removing the sacrificial layer by undercutting; lifting-off the micro-LEDs to be picked up from the carrier substrate; bonding the micro-LEDs on the pickup substrate with a receiving substrate through a third bonding layer; and lifting-off the micro-LEDs from the pickup substrate.

Preferably, the first bonding layer and the second bonding layer are of solder layers and the second bonding layer is of polymer.

Preferably, the lifting-off characteristics of the first bonding layer and the second bonding layer are different from that of the second bonding layer.

Preferably, the melting point of the first bonding layer is lower than 280° C., and the micro-LEDs to be picked up are lifted-off from the carrier substrate through heating.

Preferably, the second bonding layer is a thermal release tape, or an UV curable and laser de-bondable film.

Preferably, the sacrificial layer is a photo resist and the sacrificial layer is patterned through photo lithography.

Preferably, the sacrificial layer is removed through etchant.

Preferably, the side-length of the micro-LEDs is 1-100 μm.

Preferably, the material of the pickup substrate includes one of glass, sapphire, quartz and silicon.

According to a second aspect of the present invention, there is provided method for manufacturing a micro-LED device, comprising transferring micro-LEDs to a receiving substrate of the micro-LED device by using the micro-LED transfer method of the present invention.

Compared with the prior art, the complicated pickup head is not necessary in this invention, and the technical solution of this invention is relatively simple. So, the task to be implemented by or the technical problem to be solved by the present invention has not been conceived or anticipated by a person skilled in the art and thus the present invention is a new solution.

Further features of the present invention and advantages thereof will become apparent from the following detailed description of exemplary embodiments according to the present invention with reference to the attached drawings.

BRIEF DESCRIPTION OF THE FIGURES

The accompanying drawings, which are incorporated in and constitute a part of the specification, illustrate embodiments of the invention and, together with the description thereof, serve to explain the principles of the invention.

DETAILED DESCRIPTION OF VARIOUS EMBODIMENTS

Figure 1:
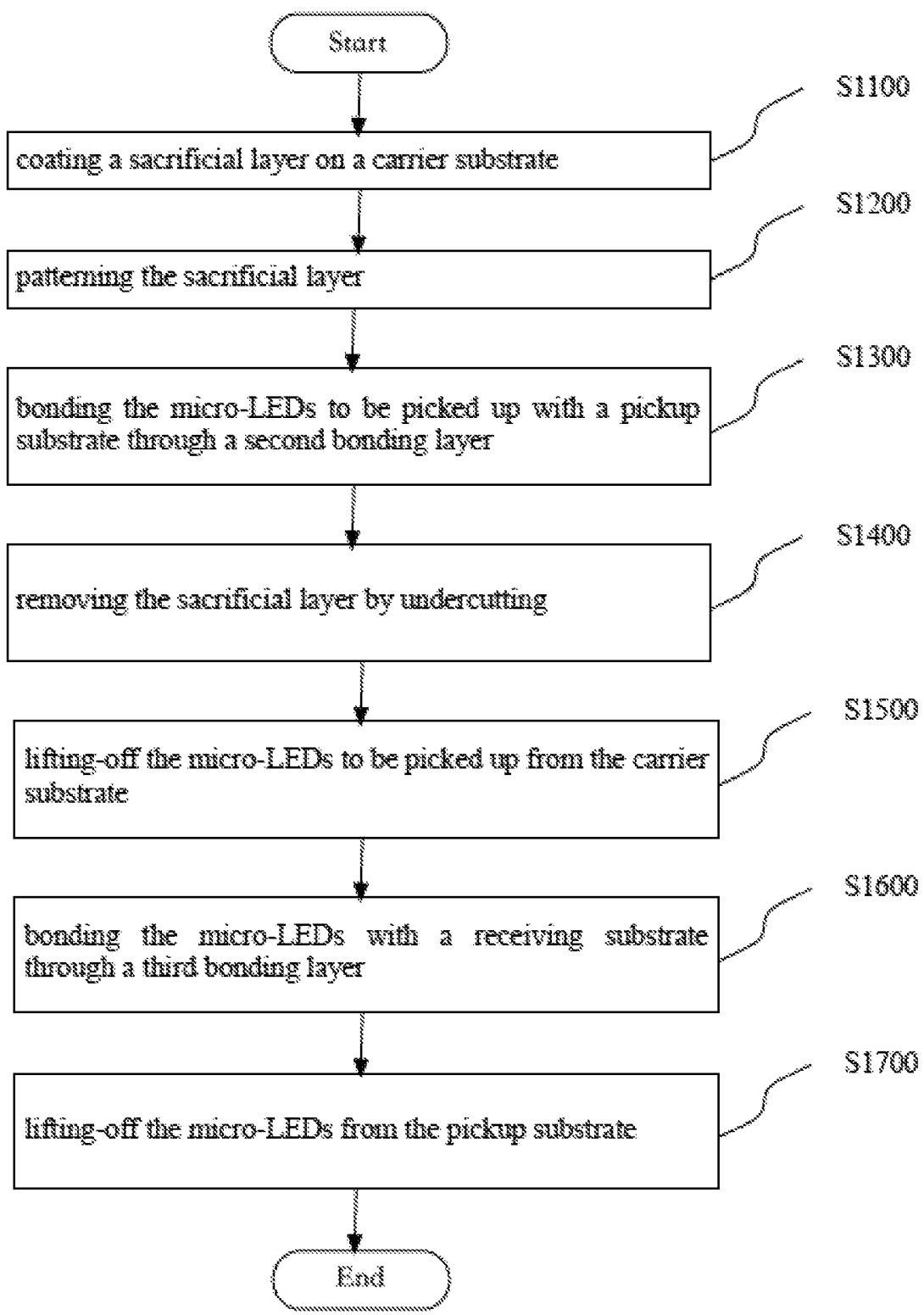
FIG. 1 is a flow chart of the method according to an embodiment of the present invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Below, the embodiments and examples will be described with reference to the accompany figures.

FIG. 1 shows the flow chart of a micro-LED transfer method according to an embodiment of the present invention.

As show in FIG. 1, at step S1100, a sacrificial layer is coated on a carrier substrate, wherein micro-LEDs are bonded on the carrier substrate through a first bonding layer.

For example, the micro-LEDs can be lateral micro-LEDs or vertical micro-LEDs. The side-length of the micro-LEDs can be 1-100 μm.

The first bonding layer can be a solder layer. The solder can be a metal or alloy with a relatively low melting point, or the combination thereof. Preferably, the melting point of the solder is lower than 280° C.; more preferably, lower than 200° C.; and even more preferably, lower than 160° C.

At step S1200, the sacrificial layer is patterned to expose micro-LEDs to be picked up.

The sacrificial layer can be a photo resist. The sacrificial layer can be patterned through photo lithography. Of course, a person skilled in the art can pattern the sacrificial layer through other approaches.

At step S1300, the micro-LEDs to be picked up are boned with a pickup substrate through a second bonding layer.

The material of the pickup substrate can include one of glass, sapphire, quartz and silicon. The second bonding layer can be a thermal release tape, or an UV curable and laser de-bondable film.

At step S1400, the sacrificial layer is removed by undercutting.

For example, the sacrificial layer can be removed by chemical undercutting. For example, an etchant can be used. The etchant is a solvent such as acetone.

At step S1500, the micro-LEDs to be picked up are lifted-off from the carrier substrate.

For example, in the situation where the first bonding layer has a relatively low melting point, the micro-LEDs to be picked up can be lifted-off from the carrier substrate through heating.

At step S1600, the micro-LEDs on the pickup substrate are bonded with a receiving substrate through a third bonding layer.

At step S1700, the micro-LEDs are lifted-off from the pickup substrate.

Based on the teaching of the present invention, a person skilled in the art would easily understand that the technical solution of the present invention per se has already indicated that the micro-LEDs can remain on the second bonding layer (the pickup substrate) when being lifted-off from the first bonding layer (the carrier substrate), and the micro-LEDs can remain on the third bonding layer (the receiving substrate) when being lifted-off from the second bonding layer (the pickup substrate). For example, the lifting-off characteristic of the first bonding layer is different from that of the second bonding layer, so that the micro-LEDs can be transferred form the carrier substrate to the pickup substrate. Furthermore, the lifting-off characteristic of the second bonding layer is different from that of the third bonding layer, so that the micro-LEDs can be transferred form the pickup substrate to the receiving substrate. The lifting-off characteristic can include lifting-off temperature, lifting-off approach and so on.

For example, the micro-LEDs can be lifted-off form the carrier substrate through heating, and can be lifted-off from the pickup substrate through a laser lifting-off.

In an example, the first bonding layer is a solder layer with low melting point, the second bonding layer is a polymer layer, and the third bonding layer is a solder layer having a relatively high melting point after bonding. In this situation, the first bonding layer can be lifted-off through heating at a first temperature, and the second bonding layer can be lifted-off thought heating at a second temperature, wherein the first temperature is lower than the second temperature.

In a preferable embodiment, alternatively, the lifting-off can be performed through a contactless manner. For example, when lifting-off, the micro-LEDs are kept on the pickup substrate or the receiving substrate through at least one of gravity, electrostatic force or magnetic force. The electrostatic force can be applied via the pads or bonding layers on the pickup substrate or the receiving substrate, for example. The magnetic force can be applied from the side of the pickup substrate or the receiving substrate, for example.

In the case where the present invention has already taught that the first bonding layer and the second bonding layer are to be lifted-off individually, this teaching is sufficient for a person skilled in the art to readily conceive a lot of manners to individually lift-off the bonding layers, even if some of the manners are inventive. Thus, the detailed descriptions for various specific lifting-off approaches are omitted in this specification.

Compared with the technique of pickup head in the prior art, the present invention does not need the manufacturing of a complicated pickup head, and thus the technical solution of the present invention is relatively simple. This can further reduce the cost to a certain degree.

Furthermore, the pickup substrates rather than pickup head arrays can easily be used for a large scale processing. So, the yield can be improved by the present invention.

Furthermore, compared with the electrostatic pickup of a pickup head, the present invention can improve the stability of pickup to a certain degree.

In another embodiment, the present invention can further include a method for manufacturing a micro-LED device. The manufacturing method comprises transfer micro-LEDs to a receiving substrate of the micro-LED device by using the above micro-LED transfer method. The micro-LED device is a display screen device, for example, and the receiving substrate is a display panel or a display substrate, for example.

Furthermore, the present invention can further include the micro-LED device manufactured by the above manufacturing method and/or an electronics apparatus comprising said micro-LED device, such as a mobile phone, pad and so on.

FIGS. 2-15 show an example for micro-LED transfer according to the present invention.

Figure 2:
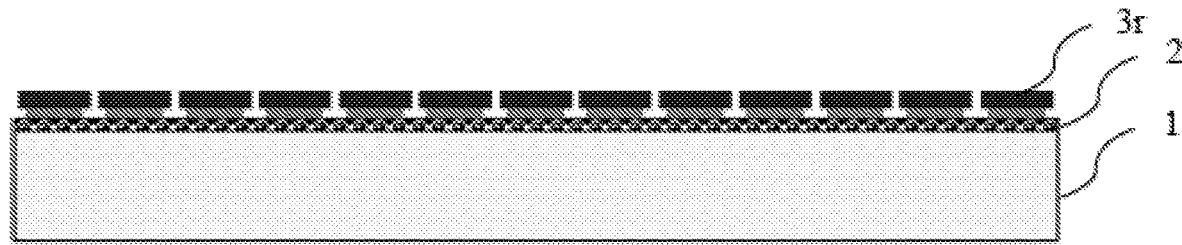
FIGS. 2-15 is a schematic diagram of an example for micro-LED transfer according to the present invention.

As shown in FIG. 2, red micro-LEDs 3r are bonded on the carrier substrate 1 through a first bonding layer 2. The first bonding layer 2 is, for example, a solder layer or an adhesive tape layer. The micro-LEDs can include p-metal, trench, dielectric and so on.

Figure 3:
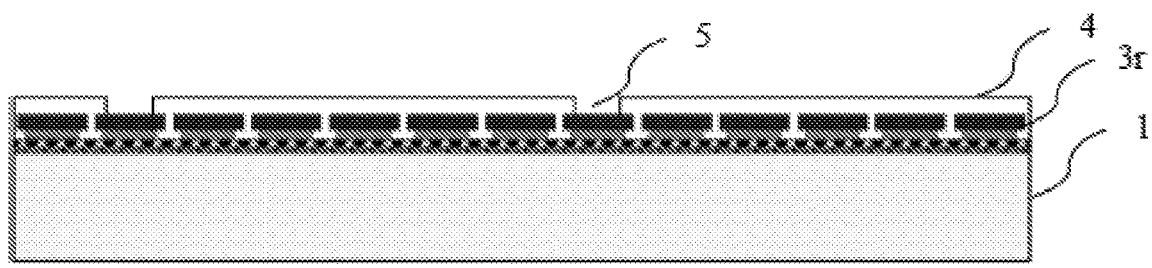

As shown in FIG. 3, a sacrificial layer 4 is coated on the carrier substrate 1. The sacrificial layer 4 covers the micro-LEDs 3r. The sacrificial layer 4 is patterned to expose micro-LEDs 3r to be picked up, as indicated by the reference sign 5 in FIG. 3. The sacrificial layer 4 can photo resist, and the sacrificial layer 4 can be patterned through photo lithography.

Figure 4:
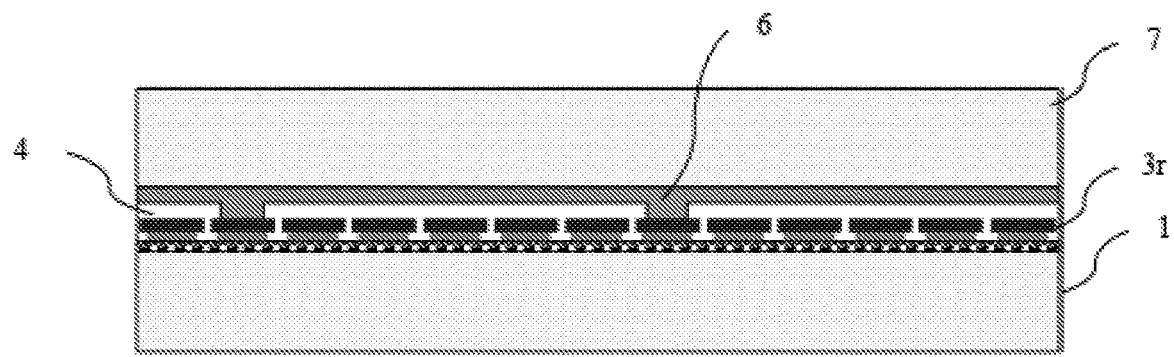

As shown in FIG. 4, the micro-LEDs 3r to be picked up are bonded onto a pickup substrate 7 through a second bonding layer 6.

The material of the second bonding layer 6 can be bonding polymer. The bonding polymer can, for example, be an UV curable and laser de-bondable film (such as 3M LC5320 available in the market), a thermal release tape, a high temperature UV tape (such as the UV releasable two-sides tape of Nitto Denko), or a photo resist different for the sacrificial layer (which can be removed by using different solvent).

Figure 5:
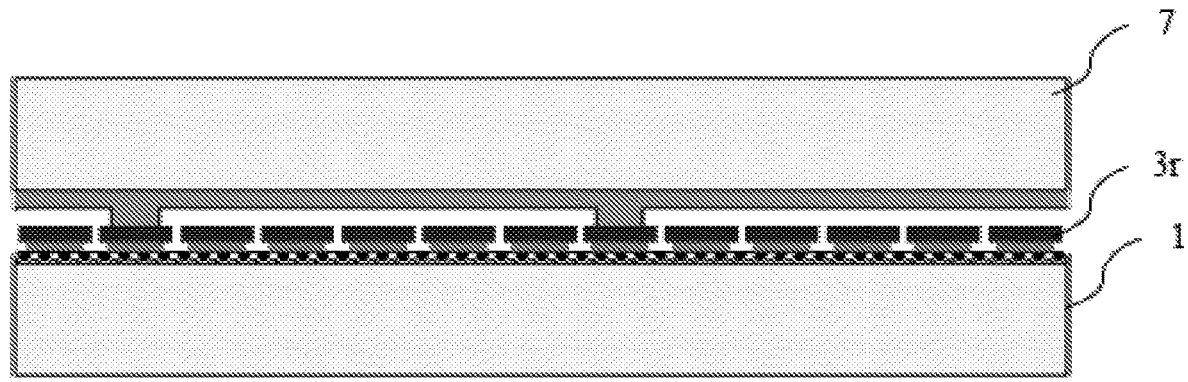

As shown in FIG. 5, the sacrificial layer 4 is removed by undercutting. For example, the sacrificial layer is removed by using solvent (etchant) such as acetone.

Figure 6:
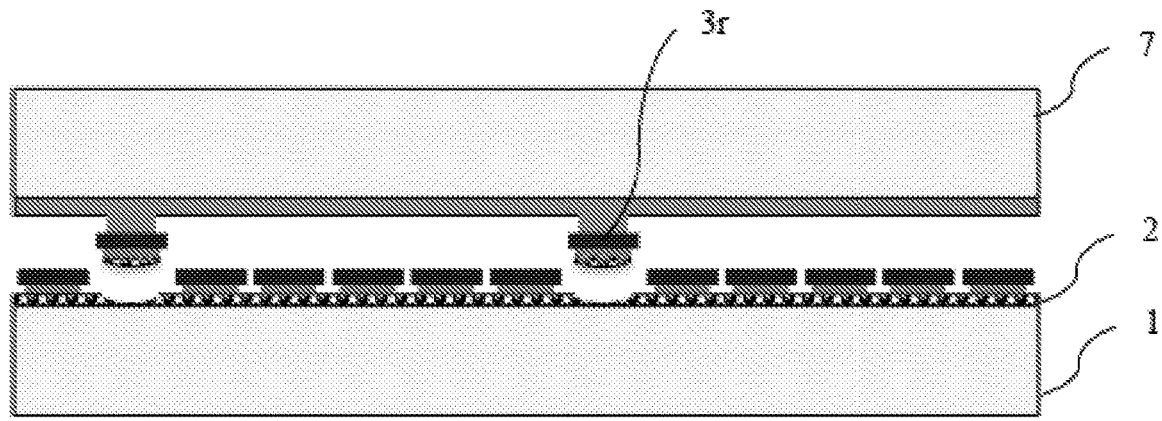

As shown in FIG. 6, the micro-LEDs to be picked up are lifted-off from the carrier substrate. For example, the first bonding layer 2 is a solder layer with relatively low melting point. The solder of the first bonding layer 2 is melted through heating, and then the pickup substrate 7 is lifted up to lift-off the micro-LEDs to be picked up.

Figure 7:
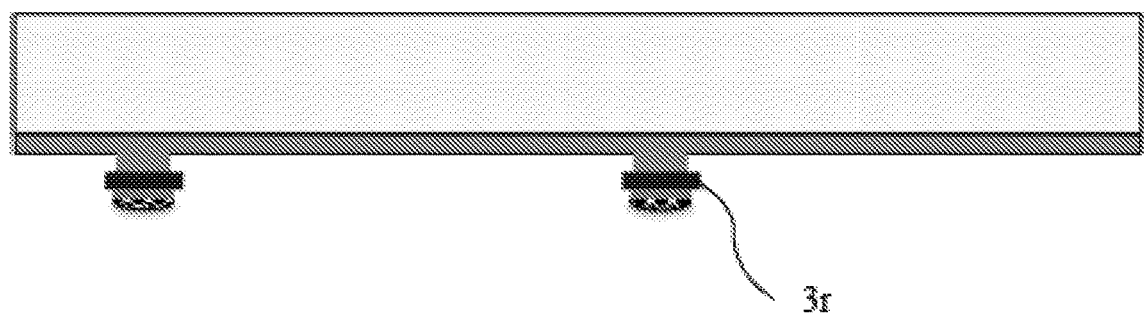
Figure 8:
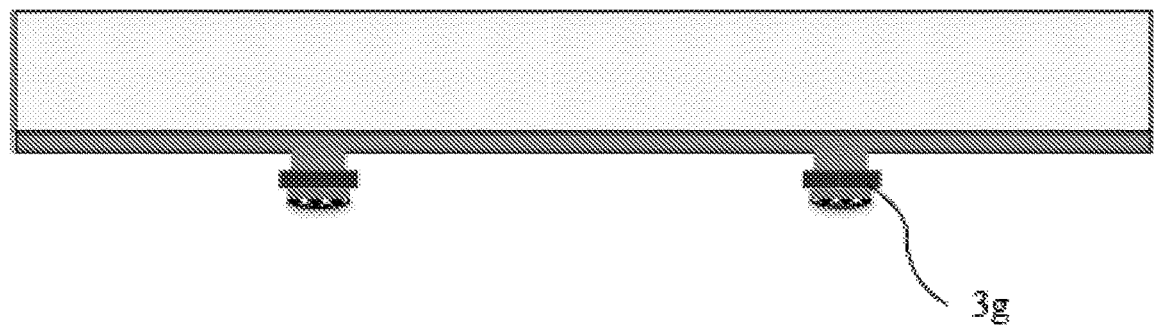
Figure 9:
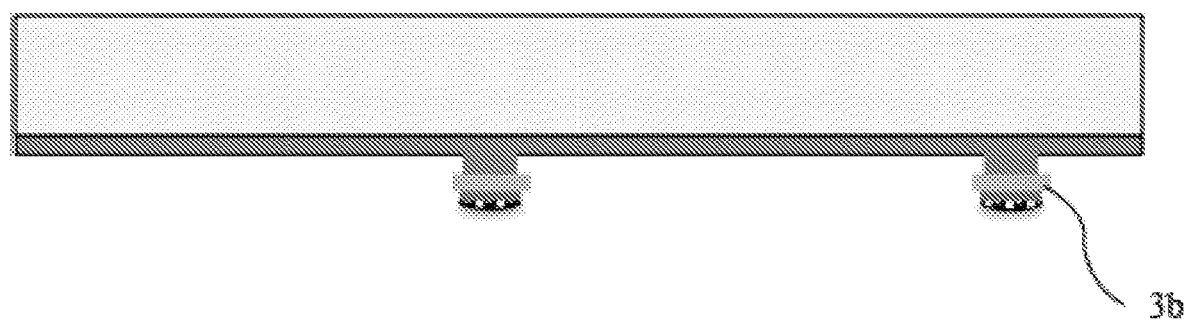

As shown in FIG. 7, the red micro-LEDs 3r are picked up by the pickup substrate. As shown in FIGS. 8 and 9, the above steps can be repeated to pick up green micro-LEDs 3g and blue micro-LEDs 3b.

Figure 10:
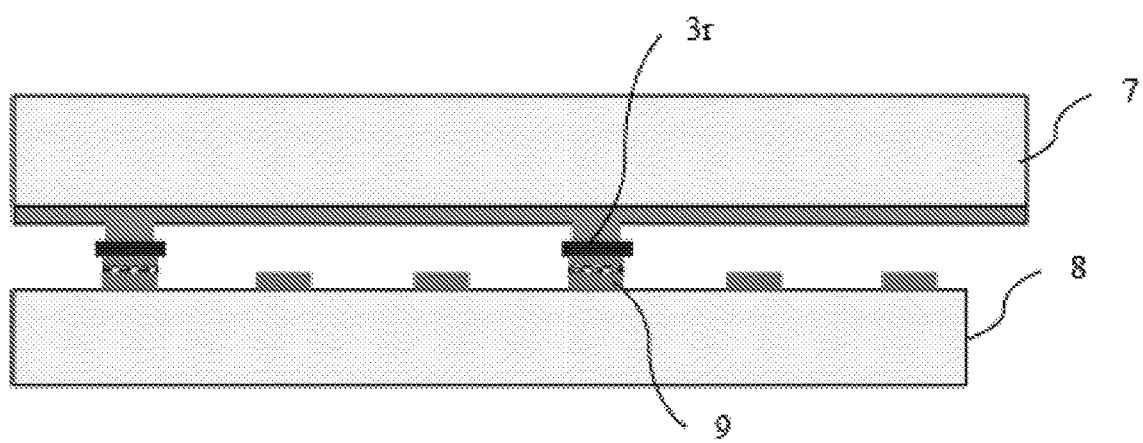
Figure 11:
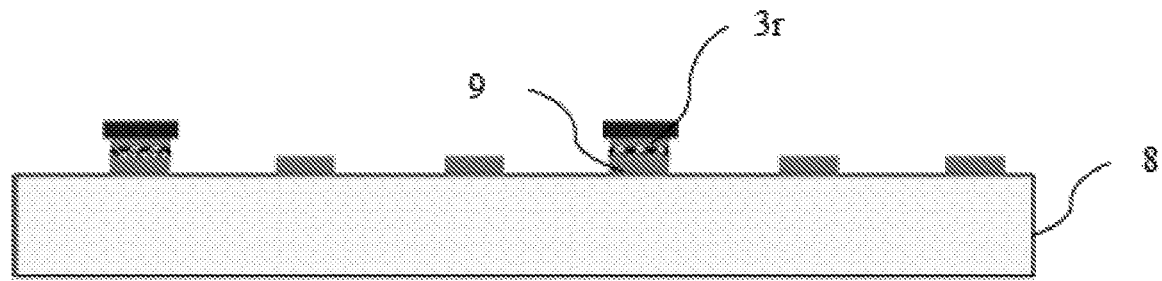

As shown in FIG. 10, the micro-LEDs 3r on the pickup substrate are bonded with a receiving substrate 8 through the third bonding layer 9. As shown in FIG. 11, the micro-LEDs 3r are lifted-off from the pickup substrate 7. For example, the micro-LED 3r can be lifted-off by laser lifting-off or thermal release and so on. As such, the red micro-LED 3r are transferred to the receiving substrate 8.

Figure 12:
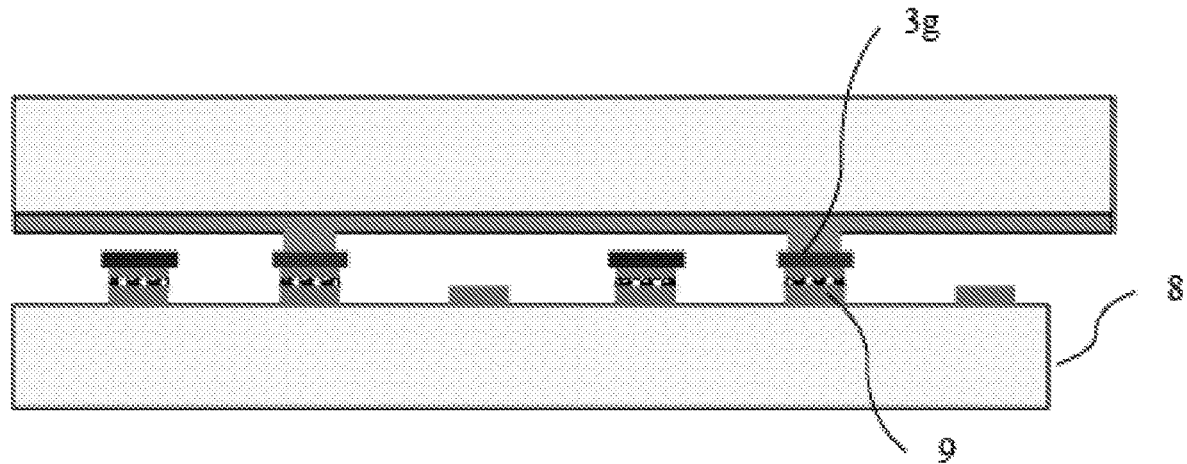
Figure 13:
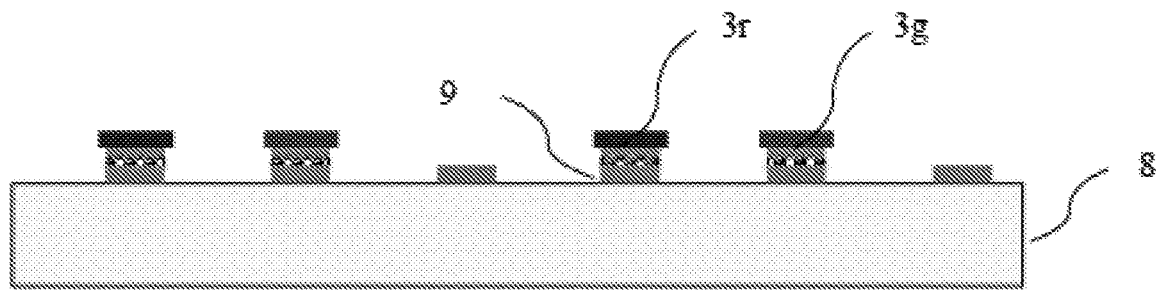

As shown in FIGS. 12 and 13, the green micro-LEDs 3g can be transferred to the receiving substrate 8 by using the same approach.

Figure 14:
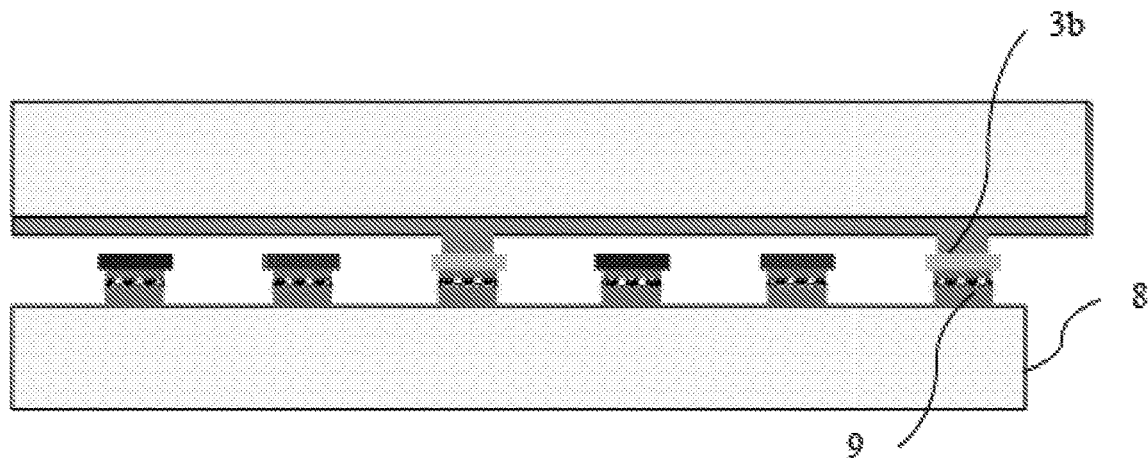
Figure 15:
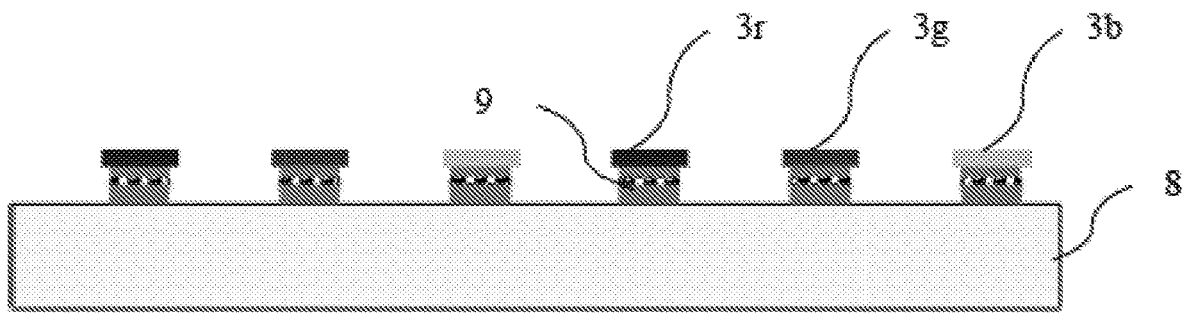

As shown in FIGS. 14 and 15, the blue micro-LEDs 3b can be transferred to the receiving substrate 8 by using the same approach.

In an example, in order to remedy the faults of certain micro-LEDs, redundant micro-LEDs can be provided by using redundant technique. As such, when a certain micro-LED does not work, a redundant micro-LED corresponding to it can be used, thereby improving the quality of a display device.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A micro-LED transfer method, the method comprising the steps of:
   coating a sacrificial layer on a carrier substrate, wherein micro-LEDs are bonded on the carrier substrate through a first bonding layer;
   exposing a first portion of the micro-LEDs to be picked up by patterning the sacrificial layer, while a second portion of the micro-LEDs is coated by the sacrificial layer;
   bonding the first portion of the micro-LEDs to be picked up with a pickup substrate through a second bonding layer;
   removing the sacrificial layer by undercutting;
   lifting-off the first portion of the micro-LEDs to be picked up from the carrier substrate by heating the first bonding layer at a first temperature;
   bonding the first portion of the micro-LEDs on the pickup substrate with a receiving substrate through a third bonding layer; and
   lifting-off the first portion of the micro-LEDs from the pickup substrate by heating the second bonding layer at a second temperature,
   wherein the first temperature is lower than the second temperature.

2. The method according to claim 1, wherein the first bonding layer and the third bonding layer are of solder layers and the second bonding layer is of polymer.

3. The method according to claim 1, wherein the lifting-off characteristics of the first bonding layer and the third bonding layer are different from that of the second bonding layer.

4. The method according to claim 1, wherein:
   the melting point of the first bonding layer is lower than 280° C.

5. The method according to claim 1, wherein the second bonding layer is a thermal release tape.

6. The method according to claim 1, wherein:
   the sacrificial layer is a photo resist; and
   the sacrificial layer is patterned through photo lithography.

7. The method according to claim 1, wherein the sacrificial layer is removed through etchant.

8. The method according to claim 1, wherein the side-length of the micro-LEDs is 1-100 μm.

9. The method according to claim 1, wherein the material of the pickup substrate includes one of glass, sapphire, quartz, or silicon.

10. A method for manufacturing a micro-LED device, said method comprising the step of transferring micro-LEDs to a receiving substrate of the micro-LED device by using the method according to claim 1.

* * * * *